Feb. 2, 1971 H. J. NIHOF 3,560,864

VOLTAGE TO PULSE FREQUENCY CONVERTER

Filed Nov. 24, 1967

PRIOR ART

INVENTOR:
H.J. NIHOF
BY:
HIS ATTORNEY

United States Patent Office 3,560,864

Patented Feb. 2, 1971

3,560,864

VOLTAGE TO PULSE FREQUENCY CONVERTER

Hendrikus J. Nihof, Amsterdam, Netherlands, assignor to Shell Oil Company, New York, N.Y., a corporation of Delaware Filed Nov. 24, 1967, Ser. No. 685,595
Claims priority, application Netherlands, Dec. 12, 1966, 6617415
Int. Cl. G06g 7/16
U.S. Cl. 328—161 3 Claims

ABSTRACT OF THE DISCLOSURE

A method and apparatus for generating a pulse frequency proportional to the ratio of the amplitude of two input signals consisting of an integrator, Schmitt trigger, capacitor and non-loading feedback circuit through which the capacitor may be discharged into the integrator.

CROSS-REFERENCES TO RELATED APPLICATION

The present invention is related to co-pending patent application, Ser. No. 442,914, entitled "Computing Circuit," by H. J. Nihof et al., and assigned to the same assignee as this invention.

BACKGROUND OF THE INVENTION

The present invention relates to voltage to frequency converters. More particularly, it relates to an improved circuit for making voltage to frequency transformations and is capable of producing a pulse frequency proportional to the ratio between two input voltages.

BRIEF DESCRIPTION OF THE DRAWING

Referring now to FIG. 1, the prior art circuit consists of an operational amplifier 20 having a capacitor 22 in a feed back loop between the input and output thereof. An input signal $V_i$ is delivered through resistor 24 to operational amplifier 20. Connected to the output of operational amplifier 20 is a voltage level discriminator circuit 26. This circuit is capable of transmitting an output pulse of a predetermined value when its input reaches a predetermined voltage level. Connected to the output of voltage level discriminator 26 are a resistor 28 and capacitor 30. A grounded diode 32 is connected to capacitor 30. The common node between capacitor 30 and diode 32 is connected to the input of operational amplifier 20 via diode 34. Diode 34 is so connected as to pass only to positive going pulses from capacitor 30 to operational amplifier 20.

Figure 1:
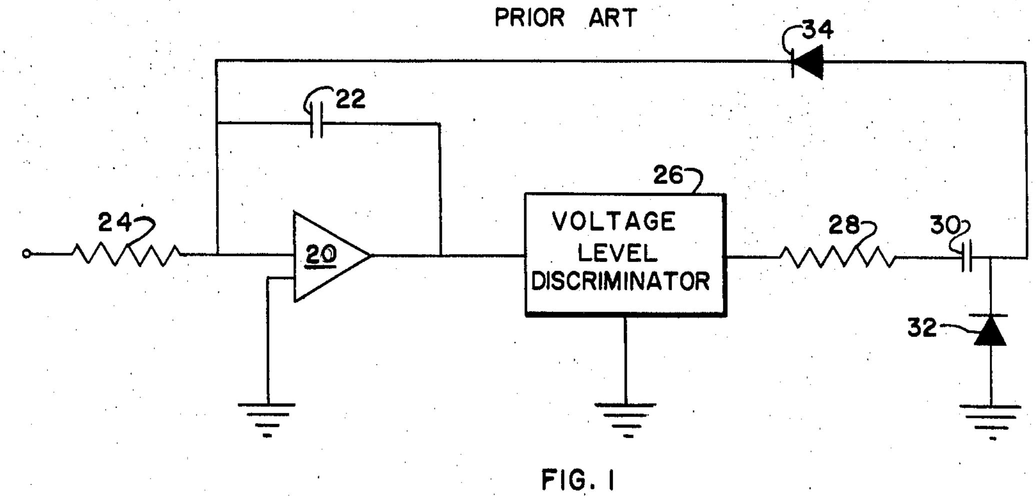
FIG. 1 is a schematic of a prior art circuit.

In the ideal case, diodes 32 and 34 would be conducting at positive voltage differences and non-conducting a negative difference across their terminals. In practice, however, diodes are conducting only when the voltage difference exceeds a positive threshold value, *e*. The quantitative value of *e* is of the order of several tenths of a volt and changes with temperature.

In operation, an input signal $V_i$ is integrated by operational amplifier 20 in conjunction with capacitor 22. When the output of operational amplifier 20 reaches a predetermined level, voltage level discriminator 26 generates an output pulse with an amplitude $V_r$. When a pulse is emitted from voltage level discriminator 26, capacitor 30 is first charged via diode 32 and then discharged into capacitor 22 via diode 34. However, owing to the threshold value, *e*, capacitor 30 is neither fully charged to $V_r$ nor fully discharged. The charge transferred at each pulse from capacitor 30 to capacitor 22 equals $C_{30}(V_r-2e)$, which leads to a frequency of operation, *f*, given by the following equation:

$$f=\frac{V_i/R_{24}}{C_{30}(V_r-2e)} \qquad (1)$$

When $V_r$ is constant, *e* is allowed for in calibrating the instrument and the effect of temperature variations on *e* is kept small by making $V_r$ large. However, when $V_r$ is varied as contemplated by the present invention, *e* seriously affects the accuracy of the instrument at low values of $V_r$.

SUMMARY OF THE INVENTION

It is therefore an object of this invention to avoid a loading effect of diodes 32 and 34 and thereby increase the accuracy of the instrument.

It is also an object of this invention to show a new use for the present apparatus.

Finally it is an object of this invention to provide an apparatus for accurately converting a ratio of two input voltages to a pulse frequency.

In accordance with the objects of the invention as taught by an illustrated embodiment, first and second operational amplifiers are provided. An integrating capacitor connected between the input and output of the first operational amplifier, and a rectifying network consisting of two parallel branches each having a resistor and diode is connected between the input and output of the second operational amplifier. The diodes are connected such that each branch of the rectifying network conducts a unidirectional current opposite in direction to that of the other branch. A voltage level discriminator circuit and a capacitor are connected in series between the output of the first operational amplifier and the input of the second operational amplifier such that the voltage level discriminator circuit receives the output of the first operational amplifier. The apparatus is completed by an electrical coupling between the input of the first operational amplifier and the rectifying circuit such that the rectifying circuit supplies a signal tending to discharge the integrating capacitor.

The objects of the present invention may further be carried out by generating a pulse frequency proportional to the ratio of two input voltages. This may be achieved by integrating a first input signal, comparing the integrated first input signal to a predetermined value; generating a voltage pulse proportional to a second input signal when said integrated first input signal reaches said predetermined value, generating a current pulse proportional to the voltage pulse, and subtracting said current pulse from said first input signal.

DESCRIPTION OF PREFERRED EMBODIMENTS

Figure 2:
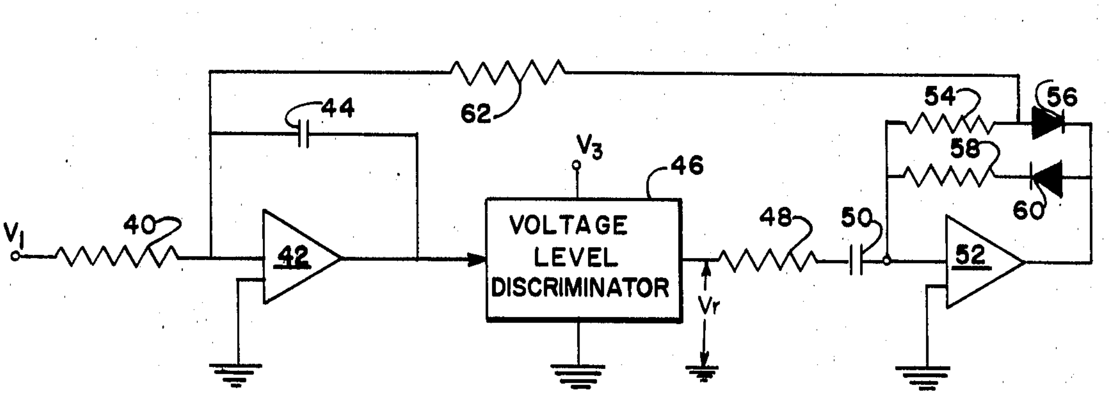
FIG. 2 is a schematic of the present invention.

FIG. 2 shows a block diagram, schematic, of an apparatus according to the present invention wherein resistor 40, amplifier 42, and capacitor 44 form an analog integrator. Input signal $V_i$ is passed to the integrator via resistor 40. At a constant voltage $V_1$ the charge of capacitor 44 and consequently the output voltage of amplifier 42 will increase monotonically. At the output of amplifier 42 is located a voltage level discriminator or break-down device 46. The voltage level discriminator may be a cathode coupled binary circuit as described in Millman and Taub, Pulse and Digital Circuits, McGraw Hill (1956). If the output voltage of amplifier 42 reaches a specific, non-critical value, then voltage level discriminator 46 supplies a voltage pulse $V_r$ proportional to a second input $V_3$.

The generated pulse of voltage level discriminator 46 charges via resistor 48 a capacitor 50. Capacitor 50 is located at the input of a nonloading feedback means. More specifically capacitor 50 is located at the input of operational amplifier 52. An operational amplifier suitable for the present invention need only have a high input impedance and a high negative gain and are manufactured by several companies including Nexus Research Laboratory of Canton, Mass. Between the input and the output of amplifier 52 there is located a rectifying network. The rectifying network includes a first branch consisting of resistor 54 connected in series with diode 56. Diode 56 is disposed to pass a positive going pulse from the input to output of amplifier 52. A second branch of the rectifying network includes resistor 58 and diode 60. The cathode of diode 60 is connected to the input of operational amplifier 52 thereby allowing it to pass positive going pulses from the output of amplifier 52. A resistor 62 interconnects the node between resistor 54 and diode 56 with the input to operational amplifier 42. It will be noted that the diodes 56 and 60 are connected in such a way that the direction of current which may be passed through one branch is opposite to that of the current that may be passed through the other branch. Owing to the capacitor 50 being charged by the pulse from voltage level discriminator 46, a charge of the same magnitude flows through the branch including resistor 58 and diode 60 to the input of operational amplifier 52. This is true since the input of operational amplifier 52 must stay substantially at zero potential. When the pulse from voltage level discriminator 46 decays, the sign of the voltage at the input of operational amplifier 52 is reversed and thereby causes the passage of a current pulse through the branch including resistor 54 and diode 56 until capacitor 50 is discharged. The passage of the capacitor discharge current pulse through resistor 54 causes a current pulse to flow through resistor 62 to capacitor 44. The sign of the current pulse reaching capacitor 44 is opposite to the sign of the current having charged capacitor 44 so that in effect capacitor 44 is discharged by the current pulse feedback via resistor 62. The quantitative value by which capacitor 44 is discharged is proportional to the charge on capacitor 50. The circuit parameter values are so chosen that the starting position of voltage level discriminator 46 is restored. Subsequently, if voltage $V_1$ has an appropriate value, capacitor 44 is again charged and the process is continued.

Owing to the high loop gain, the generated frequency will exactly take that value at which the average value of the current pulses sent back via resistor 62 equals the value of the input current via resistor 40. More specifically, when voltage level discriminator 46 is triggered, it supplies an output voltage pulse of size $V_r$ proportional to input $V_3$. This happens at a frequency $f$, as a result of which a current $i_2$ flows to capacitor 50. For this current the following equation applies:

$$i_2=fC_{50}V_r \quad (2)$$

Through resistor 54 there occurs a voltage drop, $V_2$ $$V_2=i_2R_{54} \quad (3)$$

A current $i_3$ through resistor 62 equal to $V_2/R_{62}$ compensates the input current $i_1$ passing through $R_{40}$ due to $V_1$ and can be expressed as $$i_3=\frac{V_2}{R_{62}}=\frac{fC_{50}V_rR_{54}}{R_{62}} \quad (4)$$

$$\text{Since } i_3=i_1 \quad (5)$$

$$\text{Then } \frac{V_1}{R_{40}}=\frac{fC_{50}V_rR_{54}}{R_{62}} \quad (6)$$

$$\text{and } f=K\frac{V_1}{V_r}, \text{ where} \quad (7)$$

$$K=\frac{R_{62}}{C_{50}R_{54}R_{40}} \quad (8)$$

The subscripts refer to reference numerals associated with components on the drawing.

In keeping with the objects of the invention, Equation 7 indicates that the frequency of operation of the embodiment of FIG. 2 is proportional to the ratio of $V_1$ to $V_r$ and the inherent error of the prior art circuit associated with the diode drop, $e$, has been eliminated.

Figure 3:
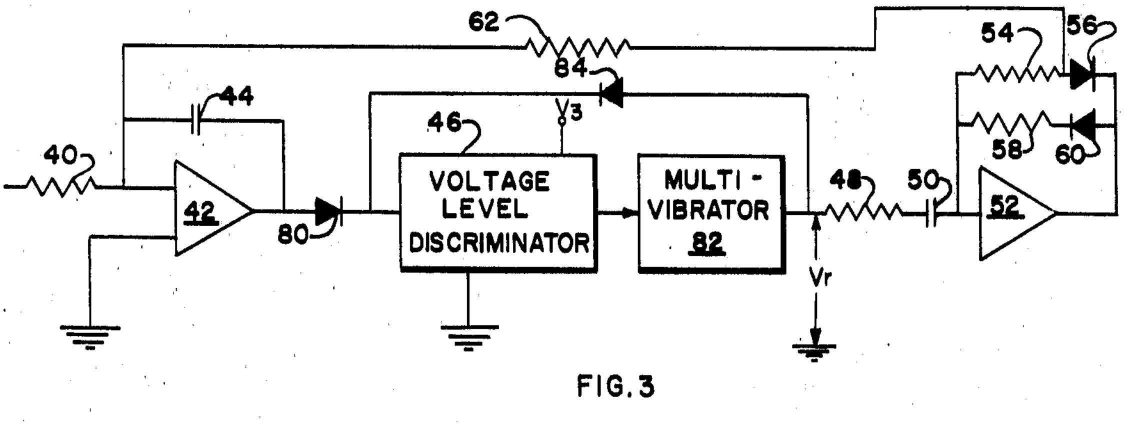
FIG. 3 is a schematic of an alternative embodiment of the present invention.

FIG. 3 shows a further embodiment of the present invention. It may be advantageous for voltage pulses to be generated with the aid of an astable multivibrator whose action is coupled with the action of the voltage level discriminator. A multivibrator produces a square-wave output with pulse widths that can be more easily adapted to the desired value of a specific circuit. A detailed description of astable multivibrators may be found in Millman and Taub, Pulse and Digital Circuits, McGraw and Hill (1956). Except as noted the embodiment of FIG. 3 will be identical to the embodiment of FIG. 2.

Referring now to FIG. 3, the output of operational amplifier 42 is separated from the input of voltage level discriminator 46 by diode 80. The output of voltage level discriminator 46 is supplied to the input of astable multivibrator 82, and the output of astable multivibrator 82 is fed-back, via diode 84, to the input of voltage level discriminator 46.

Multivibrator 82 is a square-wave voltage generator that operates only when voltage level discriminator 46 supplies a pulse. If the output voltage from amplifier 42 increases, then when a specific, non-critical value of the voltage is reached, voltage level discriminator 46 will supply a pulse. This pulse is supplied to the input of multivibrator 82 which then supplies a single voltage output pulse. The voltage pulse from multivibrator 82 has the shape of a square-wave of precisely defined amplitude and pulse width and is of sufficient length to enable capacitor 50 to be charged to the desired voltage level. The operation of the remainder of the apparatus is the same as described for FIG. 2. If the pulse supplied by the multivibrator 82 is insufficient to discharge capacitor 44 below the reset voltage necessary to return voltage level discriminator 46 to its initial state, then multivibrator 82 will supply as many more pulses as are required to discharge capacitor 44 below the reset voltage.

Diodes 80 and 84 are supplied to insure that voltage level discriminator 46 can return to its initial state only after the pulse voltage from multivibrator 82 has decayed.

The embodiment of FIG. 3 whose operation is described by Equation 7 is also successful in eliminating the errors of the prior art circuit.

I claim as my invention:

1. An improved apparatus for converting a ratio of two input voltages to a pulse frequency, comprising:
- an integrator circuit;
- a voltage level discriminator circuit connected to the output of said integrator circuit;
- a resistor serially connected to the output of said voltage level discriminator;
- a capacitor serially connected to said resistor;
- a non-loading feedback means connected between said capacitor and the input of said integrating circuit, said non-loading feedback means comprising an operational amplifier;
- a rectifying network connected between the input and output of said operational amplifier; and
- means for connecting said rectifying circuit to the input of said integrating circuit so that pulses tending to discharge said integrator are supplied thereto.

2. An improved apparatus for converting a ratio of two input voltages to a pulse frequency, comprising:
- an integrator circuit;
- a voltage level discriminator circuit connected to the ouptput of said integrator circuit;
- a resistor serially connected to the output of said voltage level discriminator;
- a capacitor serially connected to said resistor;
- a non-loading feedback means connected between said capacitor and the input of said integrating circuit, said non-loading feedback means comprising an operational amplifier;

a rectifying network connected between the input and output of said operational amplifier, said rectifying network including two parallel branches each having a resistor and diode connected such that each branch of said rectifying network conducts a unidirectional current opposite in direction to that of the other branch; and a resistor coupled between said rectifying network and said integrating circuit such that said rectifying circuit supplies a signal tending to discharge said integrating circuit.

3. An apparatus for generating a pulse frequency proportional to the ratio of a first and second input signals comprising:

an integrator circuit, said integrator circuit adapted to receive said first input signal;

a voltage level discriminator circuit connected to the output of said integrator circuit, said voltage level discriminator circuit being adapted to generate an output pulse with an amplitude proportional to said second input signal;

a multivibrator circuit operatively connected to the output of said voltage level discriminator and supplying a precisely controlled output pulse when triggered by said voltage level discriminator;

an operational amplifier;

a rectifying network connected between the input and output of said operational amplifier, said rectifying network including a first branch consisting of a serially connected resistor and diode with the anode of said diode connected to the output of said operational amplifier, a second branch connected in parallel with said first branch, said second branch consisting of a serially connected resistor and diode with the cathode of said diode connected to the output of said operational amplifier;

a resistor interconnecting the anode of the diode in said second branch and the input of said integrating circuit; and a serially connected resistor and capacitor interconnecting the input of said operational amplifier and the output of said multivibrator circuit, said capacitor being connected to the input of said operational amplifier.

References Cited

UNITED STATES PATENTS

| | | | |
|---|---|---|---|
| 3,274,501 | 9/1966 | Heinson | 307—229 |
| 3,311,751 | 3/1967 | Maestre | 307—271 |
| 3,256,426 | 6/1966 | Roth | 328—127 |
| 3,376,518 | 4/1968 | Emmer | 331—177 |
| 3,386,039 | 5/1968 | Naive | 328—167 |

DONALD D. FORRER, Primary Examiner

H. A. DIXON, Assistant Examiner

U.S. Cl. X.R.

307—229; 328—127, 146; 331—177